US012777615B2

(12) United States Patent
Hopkins et al.

(10) Patent No.: US 12,777,615 B2
(45) Date of Patent: Oct. 27, 2026

(54) HEAT TRANSFER SYSTEM CONTROLLER AND METHOD

(71) Applicant: Micron Technology, Inc., Boise, ID (US)

(72) Inventors: John Hopkins, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 18/773,959

(22) Filed: Jul. 16, 2024

(65) Prior Publication Data

US 2025/0071940 A1 Feb. 27, 2025

Related U.S. Application Data

(60) Provisional application No. 63/534,438, filed on Aug. 24, 2023.

(51) Int. Cl.
*H05K 7/20* (2006.01)
*H10P 72/00* (2026.01)

(52) U.S. Cl.
CPC ..... *H05K 7/20281* (2013.01); *H10P 72/0431* (2026.01)

(58) Field of Classification Search
CPC ........................ H05K 7/20281; H10P 72/0431
See application file for complete search history.

(56) References Cited

U.S. PATENT DOCUMENTS 5,234,601 A * 8/1993 Janke ........................ B01J 49/85 210/138
6,309,532 B1 * 10/2001 Tran ........................ G01N 30/96 204/554
2004/0182563 A1 * 9/2004 Jeong .................. H10P 72/0602 165/206
2012/0078516 A1 * 3/2012 Yoshii .................... G01N 33/18 702/2
2015/0187625 A1 * 7/2015 Busche .............. H05K 7/20218 361/234

OTHER PUBLICATIONS

WO 2008/083638 (English translation) (Year: 2008).*

* cited by examiner

*Primary Examiner* — Jonathan Bradford
(74) *Attorney, Agent, or Firm* — Schwegman Lundberg & Woessner, P.A.

(57) ABSTRACT

Apparatus and methods include cooling devices and systems. Cooling devices and methods include dissolved ions in cooling fluid, such as cooling water. Cooling devices and methods include an electrical conductivity measurement sensor within the cooling water, wherein the electrical conductivity measurement sensor includes an electrode resistant to the dissolved ions.

17 Claims, 4 Drawing Sheets

Table of limiting ion conductivity in water at 298 K (approx. 25 °C)

| Cations | $\lambda^0_+$ / mS m$^2$ mol$^{-1}$ | Cations | $\lambda^0_+$ / mS m$^2$ mol$^{-1}$ | Anions | $\lambda^0_-$ / mS m$^2$ mol$^{-1}$ | Anions | $\lambda^0_-$ / mS m$^2$ mol$^{-1}$ |
|---|---|---|---|---|---|---|---|
| $H^+$ | 34.982 | $Ba^{2+}$ | 12.728 | $OH^-$ | 19.8 | $SO^{2-}_4$ | 15.96 |
| $Li^+$ | 3.869 | $Mg^{2+}$ | 10.612 | $Cl^-$ | 7.634 | $C_2O^{2-}_4$ | 7.4 |
| $Na^+$ | 5.011 | $La^{3+}$ | 20.88 | $Br^-$ | 7.84 | $HC_2O^-_4$ | 4.306 |
| $K^+$ | 7.352 | $Rb^+$ | 7.64 | $I^-$ | 7.68 | $HCOO^-$ | 5.6 |
| $NH^+_4$ | 7.34 | $Cs^+$ | 7.68 | $NO^-_3$ | 7.144 | $CO^{2-}_3$ | 7.2 |
| $Ag^+$ | 6.192 | $Be^{2+}$ | 4.50 | $CH_3COO^-$ | 4.09 | $HSO^{2-}_3$ | 5.8 |
| $Ca^{2+}$ | 11.90 | | | $ClO^-_4$ | 6.80 | $SO^{2-}_3$ | 7.2 |
| $Co(NH_3)^{3+}_6$ | 10.2 | | | $F^-$ | 5.50 | | |

FIG. 3

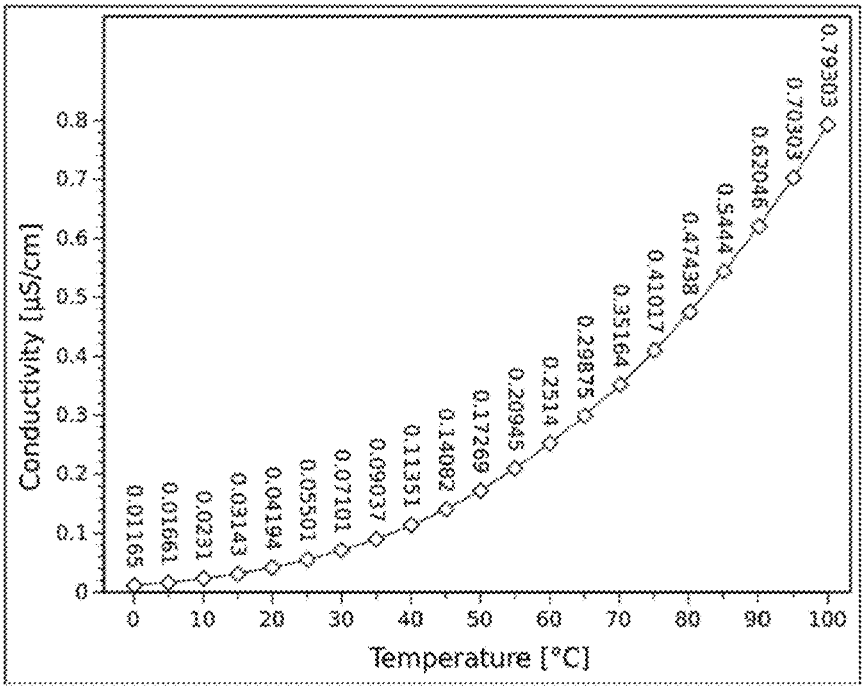

FIG. 4

HEAT TRANSFER SYSTEM CONTROLLER AND METHOD

PRIORITY APPLICATION

This application claims the benefit of priority to U.S. Provisional Application Ser. No. 63/534,438, filed Aug. 24, 2023, which is incorporated herein by reference in its entirety.

BACKGROUND

In many manufacturing processes, cooling of a workpiece or cooling of a tool is required. One method of cooling includes routing a fluid in proximity to the cooling target (workpiece, tool, etc.) where heat is transferred from the cooling target to the fluid. The heated fluid is then removed, or moved to a heat exchanger, where the heat is transferred to a different desired location, remote from the cooling target. Often, an excess of cooling capacity is used for such cooling which can be wasteful of energy.

In particular, in semiconductor device manufacture, use of cooling water as a fluid may not be as efficient as possible. Because of the large scale of manufacture and large cooling needs in semiconductor device manufacturer, cost savings and environmental benefits can be realized if improvements are made.

The present description relates generally to systems and methods, to control a heat transfer system in a manufacturing environment.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 3 illustrates conductivity data of selected example ions dissolved in water in accordance with some example embodiments.

FIG. 4 illustrates water conductivity data in accordance with some example embodiments.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
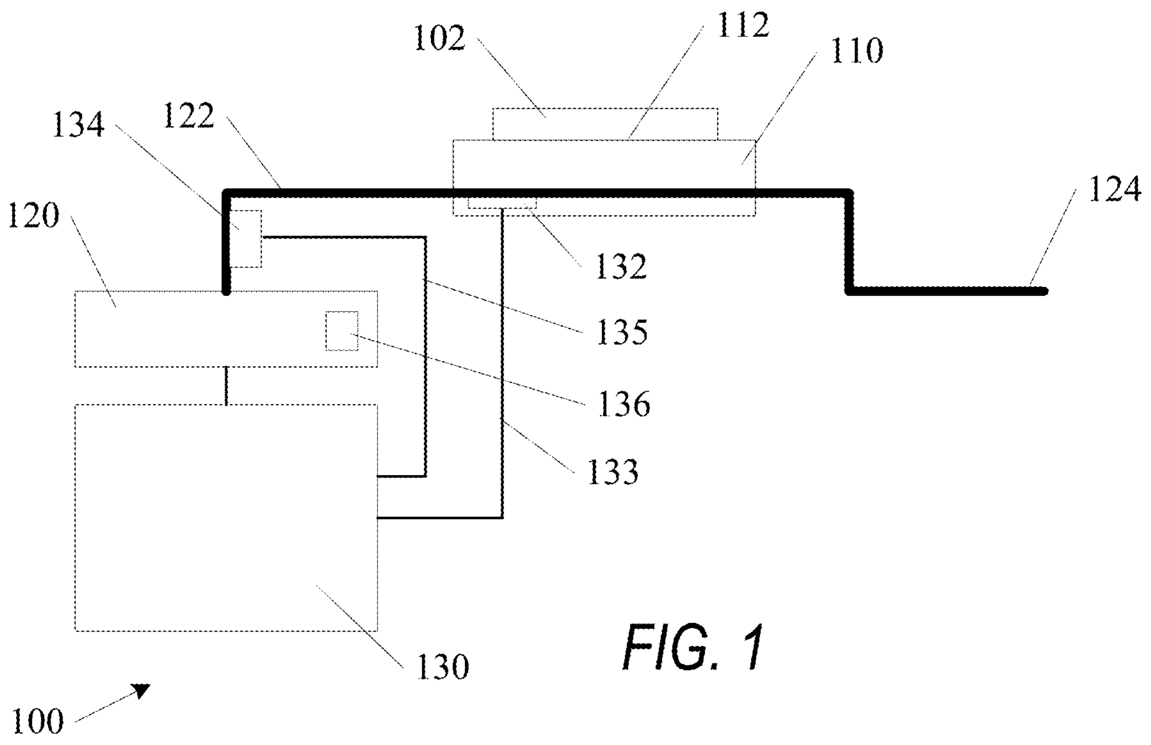
FIG. 1 illustrates a heat control system in accordance with some example embodiments.

FIG. 1 shows an example of a heat control system 100. Although a number of different pieces of manufacturing equipment can be cooled by the heat control system 100, one example operation includes semiconductor device manufacture. In semiconductor manufacture, wafers of silicon or other semiconductors are processed though several stations, and through several processes that require introduction of heat, control of heat, removal of heat or other heat management needs. Precise control of a temperature of a semiconductor wafer leads to higher quality chips and lower defects in manufacture. Manufacturer of semiconductor devices also requires a lot of energy to heat and cool workpieces and tooling during manufacture. Improving efficiency in cooling leads to improved quality and reduced cost.

Figure 2:
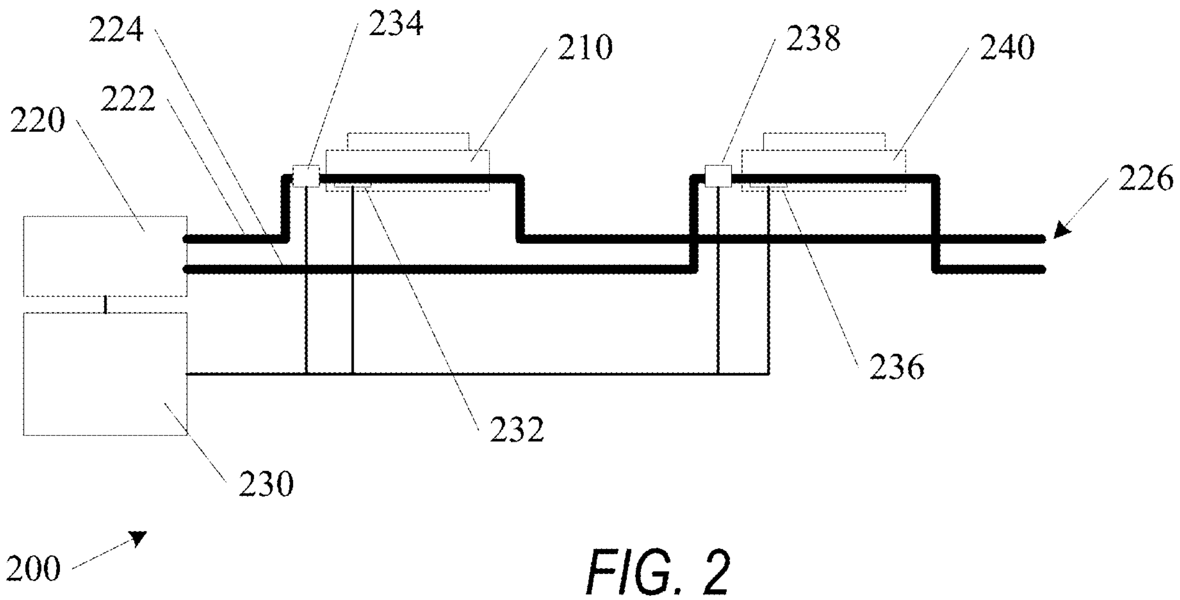
FIG. 2 illustrates another heat control system in accordance with some example embodiments.

Although a semiconductor manufacturing operation is used as an example in FIGS. 1 and 2, the invention is not so limited. Heat control systems described can be used to improve manufacturing efficiency in any industry where heat removal is required.

In FIG. 1, the heat control system 100 includes a cooling target 110. One example of a cooling target 110 includes a wafer chuck in a semiconductor manufacture facility. A wafer chuck holds a semiconductor wafer 102 during one or more processing operations. Semiconductor processing operations utilizing heat removal include, but are not limited to, annealing, plasma etching, ion implantation, physical vapor deposition, etc. In one example, a wafer chuck is moved between multiple stations, some or all of which utilize cooling of the wafer 102. By cooling the wafer chuck as described in examples of the present disclosure, improved chip quality and reduced manufacturing costs are realized.

The heat control system 100 of FIG. 1 further shows a cooling fluid supply 120. In one example, the cooling fluid includes water. In one example, the water includes one or more dissolved ions. The inclusion of dissolved ions improves sensitivity to temperature measurement of the water. Because the temperature sensitivity is improved, tighter controls can be implemented over precise cooling operations. The improved precision provides improved product quality and allows cooling processes to be more efficient as described in examples below. Within some ranges of dissolved ion concentrations, the improvement in sensitivity to temperature measurement is exponential. Highly accurate and fast measurement of temperature is provided by examples described.

FIG. 1 shows the cooling fluid supply 120 coupled to a conduit 122. In one example, the fluid supply 120 includes a pump 136, although the invention is not so limited. Other systems for driving fluid, such as pressurization, gravity, etc. are also within the scope of the invention. The conduit 122 is thermally coupled to the cooling target 110. In the example shown, thermal coupling includes the conduit 122 passing directly through the cooling target 110 adjacent to the wafer 102. In the example of FIG. 1, the wafer 102 forms a direct interface 112 with the cooling target 110, thus providing good heat transfer from the wafer 102 to the cooling target 110. This configuration provides good heat transfer from the wafer 102 to the cooling target 110, to cooling water within the conduit 122. The cooling water is then transported away from the cooling target 110 to an external location 124. The external location 124 may include a large heat sink, such as an outdoor pond, or the external location 124 may include a heat transfer system such as a radiator where the cooling water transfers heat to external air, and the cooling water is recycled back to the cooling fluid supply 120.

FIG. 1 shows an electrical conductivity measurement sensor 132 within cooling water of the conduit 122. In one example, the electrical conductivity measurement sensor 132 includes electrodes that measure a conductivity of cooling water of the conduit 122. Because of inclusion of dissolved ions in the cooling water of the conduit 122, temperature sensitivity is improved over other fluids. Using the electrical conductivity measurement sensor 132 to detect a conductivity, provides a highly sensitive correlated temperature of the cooling water of the conduit 122 at a specific location of the electrical conductivity measurement sensor 132.

A controller 130 includes circuitry that processes the conductivity and related cooling water temperature measured at the location of the electrical conductivity measurement sensor 132. In one example, the controller 130 is configured to use the measured water temperature and to adjust a flow rate of the cooling water in the conduit 122 based on an amount of cooling required at the cooling target 110 and the measured cooling water temperature. A valve 134 is shown in FIG. 1 to adjust a flow rate in conduit 122. Communication lines 133 and 135 are shown in communication between the controller 130 and the electrical conductivity measurement sensor 132 and between the controller 130 and the valve 134.

In one example, proximity of the electrical conductivity measurement sensor 132 to the cooling target 110 provides improved cooling control. By locating the electrical conductivity measurement sensor 132 within the cooling target 110, a more accurate feedback of temperature data to the controller 130 is provided, and as a result, more consistent and accurate temperature control at the cooling target 110 is achieved.

In one example, the controller further calculates a time to a desired temperature based on flow rate, and temperature differential between the water temperature and the cooling target 110. In one example, a smaller temperature differential between the water temperature and the cooling target 110 calls for a higher flow rate to remove heat quicker from the cooling target 110. In one example, a higher temperature differential between the water temperature and the cooling target 110 does not need as high a flow rate to remove heat from the cooling target 110 as with a lower temperature differential.

As discussed above, the presence of dissolved ions in the water provides an improved sensitivity to resistivity, which in turn provides an improved sensitivity to water temperature. In one example, dissolved ions include sodium and chlorine, however the invention is not so limited. Sodium and chlorine ions dissolved in water may be cost beneficial due to an abundant supply in nature, for example sea water. In one example, an amount of dissolved ions includes an amount between 35 g/L and 50 g/L.

Dissolved ions in water can enhance unwanted corrosion in electrodes of the electrical conductivity measurement sensor 132. Corrosion can change conductivity measurements due to corrosion product dielectric properties. To avoid or reduce corrosion and maintain desired accuracy of resistivity and temperature data, electrode material selection is important. In one example, one or more electrodes in the electrical conductivity measurement sensor 132 includes stainless steel. In one example, one or more electrodes in the electrical conductivity measurement sensor 132 includes carbon. A choice of electrode material may depend on a type of dissolved ion in the water. Other possibility of low corrosion electrode materials include, but are not limited to, titanium, gold, etc.

FIG. 2 shows another example heat control system 200. The system 200 includes multiple cooling targets that may be included in multiple semiconductor processing devices. A first cooling target 210 and a second cooling target 240 are shown as examples. In one example, the first cooling target 210 and the second cooling target 240 are both in a single semiconductor processing device. In one example, the first cooling target 210 and the second cooling target 240 are in separate semiconductor processing devices. One example includes multiple cooling targets in different manufacturing lines. One example includes multiple cooling targets in different devices within the same manufacturing line. Similar to examples above, in one example one or more of the cooling targets 210, 240 includes a wafer chuck.

The heat control system 200 of FIG. 2 further shows a cooling fluid supply 220. In one example, the cooling fluid includes water. In one example, the water includes one or more dissolved ions. The inclusion of dissolved ions improves sensitivity to temperature measurement of the water. FIG. 2 shows the cooling fluid supply 220 coupled to a first conduit 222 and a second conduit 224. In the example of FIG. 2, the first conduit 222 supplies cooling fluid to the first cooling target 210 and the second conduit 224 supplies cooling fluid to the second cooling target 240. In the system 200 illustrated in FIG. 2, both the conduits 222, 224 lead to an external location 226 after passing through the cooling targets 210, 240.

FIG. 2 shows a first electrical conductivity measurement sensor 232 within cooling water of the first conduit 222. In one example, the first electrical conductivity measurement sensor 232 includes electrodes that measure a conductivity of cooling water of the conduit 222. FIG. 2 also shows a second electrical conductivity measurement sensor 236 within cooling water of the second conduit 224. As with the first electrical conductivity measurement sensor 232, in one example, the second electrical conductivity measurement sensor 236 includes electrodes that measure a conductivity of cooling water of the second conduit 224.

A controller 230 includes circuitry that processes the conductivity and related cooling water temperature measured at the location of the first and second electrical conductivity measurement sensors 232, 236. In one example, the controller 230 is configured to use the measured water temperature and to adjust a flow rate of the cooling water in the first and second conduits 222, 224 based on an amount of cooling required at the first and second cooling targets 210, 240 and the measured cooling water temperature. A first valve 234 and a second valve 238 are shown in FIG. 2 to adjust respective flow rates in the conduit 222, 224 based on their individual cooling needs at the cooling targets 210, 240.

As illustrated in FIG. 2, a single cooling fluid supply 220 can be used to cool multiple cooling targets anywhere in a semiconductor manufacturing facility. Additionally, in one example, the cooling fluid supply 220 can use recycled cooling water. Even if a temperature of cooling water in the cooling fluid supply 220 goes up or down, or fluctuates during manufacture, by measuring a temperature in the conduits 222, 224, a flow rate can be adjusted accordingly to provide the desired cooling. Similar to the example of FIG. 1, the controller 230 can further calculate a time to a desired temperature based on flow rate, and temperature differential between the water temperature and the cooling targets 210, 240.

FIG. 3 shows a table of some example ions for dissolution within water for use in cooling systems 100, 200 as described above. An associated electrical conductivity for each ion is shown in the table. Higher conductivities can provide improved speed in detection and as a result, improved temperature change response time.

FIG. 4 shows a table of electrical conductivity for pure water without any dissolved ions. As can be seen from the figure, as temperature increases, an electrical conductivity changes. The change in conductivity is data that can be used to determine a water temperature. When dissolved ions, such as the non-limiting list of ions from FIG. 3, are added to water, the electrical conductivity of water as shown in FIG. 4 is increased, which improves both detection time, and sensitivity to small temperature changes.

Figure 5:
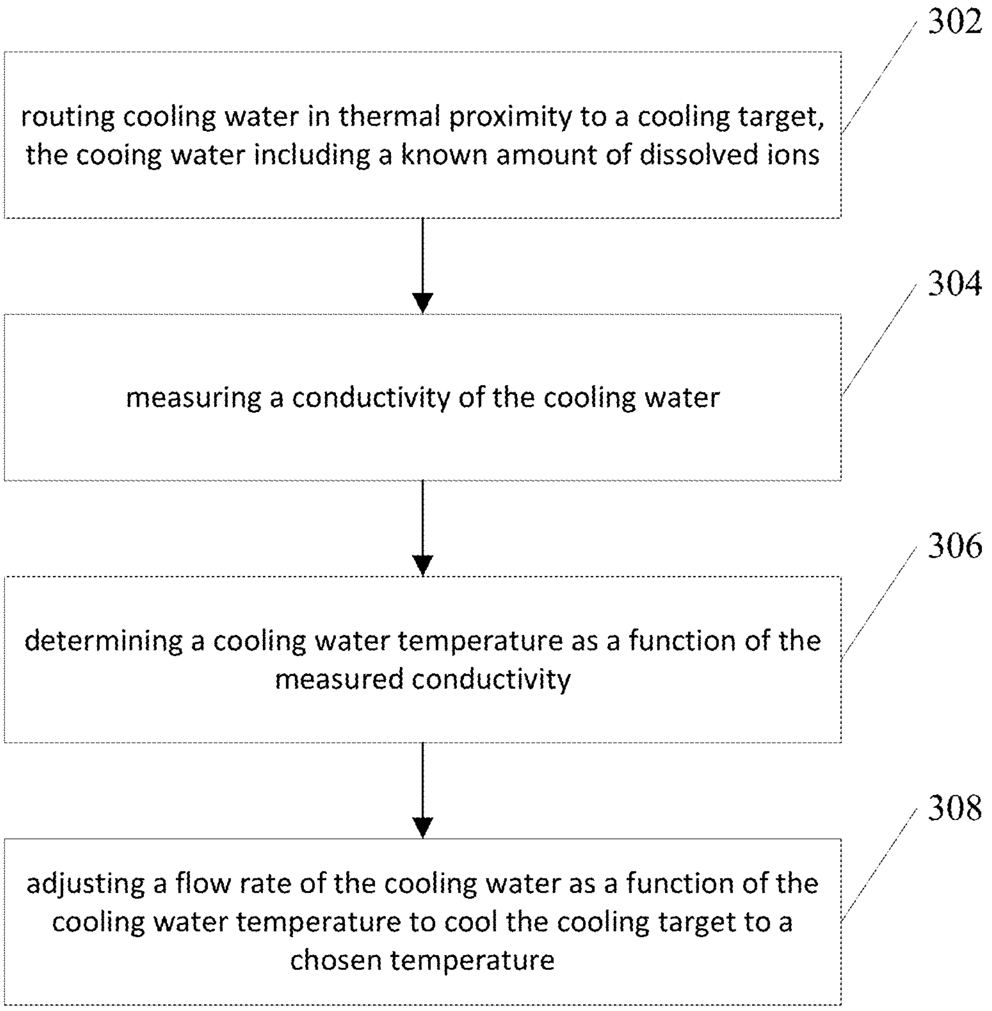
FIG. 5 illustrates an example method flow diagram in accordance with other example embodiments.

FIG. 5 shows a flow diagram of one example method of cooling. In operation 302, cooling water is routed in thermal proximity to a cooling target. The cooing water includes a known amount of dissolved ions. In operation 304, a conductivity of the cooling water is measured. In operation 306, a cooling water temperature is determined as a function of the measured conductivity, and in operation 308, a flow rate of the cooling water is adjusted as a function of the cooling water temperature to cool the cooling target to a chosen temperature. In one example, a semiconductor manufacture component is coupled to the cooling target, and as a result, the semiconductor manufacture component is cooled. In one example, the cooling target includes a wafer chuck.

Figure 6:
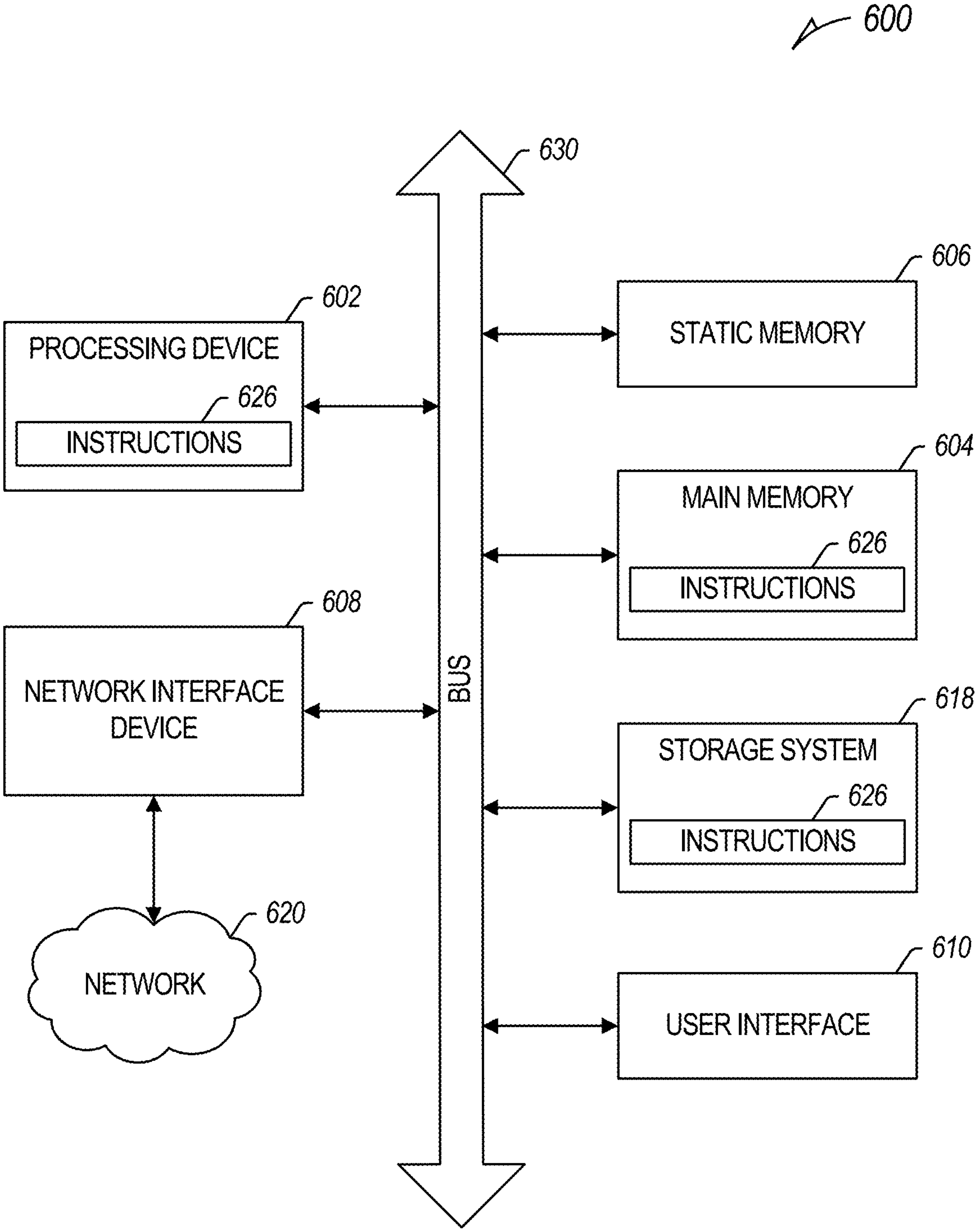
FIG. 6 illustrates an example block diagram of an information handling system in accordance with some example embodiments.

FIG. 6 illustrates a block diagram of an example machine (e.g., a host system) 600 that may be used for control of one or more of the techniques (e.g., methodologies) discussed herein may perform (e.g., such as those described in FIG. 1, etc.). In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (Saas), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a user interface 610, such as one or more of a display unit, an alphanumeric input device (e.g., a keyboard), and a user interface (UI) navigation device (e.g., a mouse), etc. In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under"

are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" is used herein to refer generally to any structure on which integrated circuits are formed, and also to such structures during various stages of integrated circuit fabrication. The term "substrate" is used to refer to either a wafer, or other structures which support or connect to other components, such as memory die or portions thereof. Thus, the term "substrate" embraces, for example, circuit or "PC" boards, interposers, and other organic or non-organic supporting structures (which in some cases may also contain active or passive components). The following detailed description is, therefore, not to be taken in a limiting sense, and the scope of the various embodiments is defined only by the appended claims, along with the full scope of equivalents to which such claims are entitled.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

To better illustrate the method and apparatuses disclosed herein, a non-limiting list of examples is provided here:

In some aspects, the techniques described herein relate to a heat control system, including: a cooling target; cooling water within a conduit, the conduit thermally coupled to the cooling target; dissolved ions in the cooling water at a known concentration; an electrical conductivity measurement sensor within the cooling water, wherein the electrical conductivity measurement sensor includes an electrode resistant to the dissolved ions; and circuitry configured to measure a cooling water temperature as a function of a measured electrical conductivity, and to adjust a flow rate of the cooling water based on an amount of cooling required at the cooling target and the cooling water temperature.

In some aspects, the techniques described herein relate to a heat control system, wherein the dissolved ions provide electrical conductivity in a range between 50 mS/cm and 70 mS/cm.

In some aspects, the techniques described herein relate to a heat control system, wherein the electrode is stainless steel.

In some aspects, the techniques described herein relate to a heat control system, wherein the electrode is carbon.

In some aspects, the techniques described herein relate to a heat control system, wherein the dissolved ions include Na and Cl.

In some aspects, the techniques described herein relate to a heat control system, wherein the cooling target includes a wafer chuck.

In some aspects, the techniques described herein relate to a heat control system, wherein the electrode is located at the wafer chuck.

In some aspects, the techniques described herein relate to a method of heat management, including: routing cooling water in thermal proximity to a cooling target, the cooing water including a known amount of dissolved ions; measuring a conductivity of the cooling water; determining a cooling water temperature as a function of the measured conductivity; and adjusting a flow rate of the cooling water as a function of the cooling water temperature to cool the cooling target to a chosen temperature.

In some aspects, the techniques described herein relate to a method, wherein measuring conductivity includes measuring with an electrode adjacent to the cooling target.

In some aspects, the techniques described herein relate to a method, wherein measuring conductivity includes measuring with a stainless steel electrode.

In some aspects, the techniques described herein relate to a method, wherein measuring conductivity includes measuring with a carbon electrode.

In some aspects, the techniques described herein relate to a method, wherein routing cooling water includes routing sea water in thermal proximity to a cooling target.

In some aspects, the techniques described herein relate to a method, wherein routing cooling water includes routing water having an amount of dissolved ions between 35 g/L and 50 g/L.

In some aspects, the techniques described herein relate to a method of cooling a semiconductor manufacture component routing cooling water in thermal proximity to a semiconductor manufacture component, the cooing water including a known amount of dissolved ions; measuring a conductivity of the cooling water; determining a cooling water temperature as a function of the measured conductivity; and adjusting a flow rate of the cooling water as a function of the cooling water temperature to cool the semiconductor manufacture component to a chosen temperature.

In some aspects, the techniques described herein relate to a method, wherein routing cooling water in thermal proximity to a semiconductor manufacture component includes routing cooling water in thermal proximity to a wafer chuck.

In some aspects, the techniques described herein relate to a method, wherein routing cooling water in thermal proximity to a semiconductor manufacture component includes routing cooling water to multiple semiconductor manufacture components; and adjusting a flow rate of the cooling water includes adjusting a flow rate at each of the multiple semiconductor manufacture components as a function of different cooling water temperatures measured at each of the multiple semiconductor manufacture components.

In some aspects, the techniques described herein relate to a method, wherein routing cooling water to multiple semiconductor manufacture components includes routing to each of the multiple semiconductor manufacture components in parallel.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A heat control system, comprising:

a cooling target;

cooling water within a conduit, the conduit thermally coupled to the cooling target;

dissolved ions in the cooling water at a known concentration;

an electrical conductivity measurement sensor within the cooling water, wherein the electrical conductivity measurement sensor includes an electrode material chosen from stainless steel, carbon, titanium, and gold; and circuitry configured to measure a cooling water temperature as a function of a measured electrical conductivity, and to adjust a flow rate of the cooling water based on an amount of cooling required at the cooling target and the cooling water temperature.

2. The heat control system of claim 1, wherein the dissolved ions provide electrical conductivity in a range between 50 mS/cm and 70 mS/cm.

3. The heat control system of claim 1, wherein the electrode is stainless steel.

4. The heat control system of claim 1, wherein the electrode is carbon.

5. The heat control system of claim 1, wherein the dissolved ions include Na and Cl.

6. The heat control system of claim 1, wherein the cooling target includes a wafer chuck.

7. The heat control system of claim 6, wherein the electrode is located at the wafer chuck.

8. A method of heat management, comprising:

routing cooling water in thermal proximity to a cooling target, the cooling water including a known amount of dissolved ions;

measuring a conductivity of the cooling water;

determining a cooling water temperature as a function of the measured conductivity; and adjusting a flow rate of the cooling water as a function of the cooling water temperature to cool the cooling target to a chosen temperature.

9. The method of claim 8, wherein measuring conductivity includes measuring with an electrode adjacent to the cooling target.

10. The method of claim 8, wherein measuring conductivity includes measuring with a stainless steel electrode.

11. The method of claim 8, wherein measuring conductivity includes measuring with a carbon electrode.

12. The method of claim 8, wherein routing cooling water includes routing sea water in thermal proximity to a cooling target.

13. The method of claim 8, wherein routing cooling water includes routing water having an amount of dissolved ions between 35 g/L and 50 g/L.

14. A method of cooling a semiconductor manufacture component, comprising:

routing cooling water in thermal proximity to a semiconductor manufacture component, the cooling water including a known amount of dissolved ions;

measuring a conductivity of the cooling water;

determining a cooling water temperature as a function of the measured conductivity; and adjusting a flow rate of the cooling water as a function of the cooling water temperature to cool the semiconductor manufacture component to a chosen temperature.

15. The method of claim 14, wherein routing cooling water in thermal proximity to a semiconductor manufacture component includes routing cooling water in thermal proximity to a wafer chuck.

16. The method of claim 14, wherein routing cooling water in thermal proximity to a semiconductor manufacture component includes routing cooling water to multiple semiconductor manufacture components; and adjusting a flow rate of the cooling water includes adjusting a flow rate at each of the multiple semiconductor manufacture components as a function of different cooling water temperatures measured at each of the multiple semiconductor manufacture components.

17. The method of claim 16, wherein routing cooling water to multiple semiconductor manufacture components includes routing to each of the multiple semiconductor manufacture components in parallel.

* * * * *